(12) United States Patent
Miyoshi

(10) Patent No.: US 7,068,031 B2
(45) Date of Patent: Jun. 27, 2006

(54) MR IMAGING METHOD AND MRI SYSTEM

(75) Inventor: Mitsuharu Miyoshi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/049,610

(22) Filed: Feb. 1, 2005

(65) Prior Publication Data

US 2005/0168221 A1 Aug. 4, 2005

(30) Foreign Application Priority Data

Feb. 3, 2004 (JP) .............................. 2004-026894

(51) Int. Cl.
*G01V 3/00* (2006.01)
(52) U.S. Cl. .................................. 324/307; 324/309
(58) Field of Classification Search ................ 324/307, 324/309, 306
See application file for complete search history.

(56) References Cited

U.S. PATENT DOCUMENTS

| | | | |
|---|---|---|---|
| 6,147,493 A | 11/2000 | Miyoshi | |
| 6,339,332 B1* | 1/2002 | Deimling | .................... 324/309 |
| 6,466,016 B1 | 10/2002 | Miyoshi | |
| 6,515,476 B1 | 2/2003 | Oshio et al. | |
| 6,559,643 B1 | 5/2003 | Miyoshi | |
| 6,597,172 B1 | 7/2003 | Miyoshi | |
| 6,608,479 B1* | 8/2003 | Dixon et al. | ................. 324/307 |
| 6,630,827 B1 | 10/2003 | Miyoshi et al. | |
| 6,664,787 B1 | 12/2003 | Miyoshi et al. | |
| 6,750,651 B1* | 6/2004 | Overall | ....................... 324/309 |
| 6,774,629 B1 | 8/2004 | Miyoshi | |
| 6,814,280 B1 | 11/2004 | Miyoshi et al. | |
| 6,856,134 B1* | 2/2005 | Reeder et al. | ............... 324/309 |
| 6,922,054 B1* | 7/2005 | Hargreaves et al. | ......... 324/307 |

FOREIGN PATENT DOCUMENTS

JP 2001-000414 1/2001

OTHER PUBLICATIONS

Brian A. Hargreaves et al.; Fat-Suppressed Steady-State Free Precession Imaging Using Phase Detection; Magnetic Resonance in Medicine 50:210-213 (2003).

(Continued)

*Primary Examiner*—Louis M. Arana
(74) *Attorney, Agent, or Firm*—Carl B. Horton, Esq.; Armstrong Teasdale LLP

(57) ABSTRACT

An MR imaging includes acquiring echoes from the object by implementing a pulse sequence which specifies the conditions which should be established with spins excited in the steady-state free precession (SSFP) method, so that the object can be scanned with an echo induced by water contained in the object and an echo induced by fat contained therein in single quadrature with each other or with a phase difference of 90° between the echoes induced by water and fat, constructing a tomographic image by performing frequency transformation on the acquired echoes, compensating the transformed data for the inhomogeneity in a static magnetic field and reconstructing an image, of which water and fat components are separated from each other, according to the result of the compensation.

18 Claims, 7 Drawing Sheets

OTHER PUBLICATIONS

Klaus Scheffler et al.; Magnetization Preparation During the Steady State: Fat-Saturated 3D TrueFISP; Magnetic Resonance in Medicine 45:1075-1080 (2001).

Shreyas S. Vasanawala et al.; Fluctuating Equilibrium MRI; Magnetic Resonance in Medicine 42:876-883 (1999).

Mitsuharu Miyoshi et al.;Patent Application entitled Mr Data Acquisition Method, Mr Image Construction Method, and MRI System: AT Dkt. No. 16NM03280; 35 pgs.; Filed Feb. 1, 2005.

* cited by examiner

SQFWI: SINGLE QUADRATURE FAT/WATER IMAGING METHOD

FIG. 5A EXCITATION PULSE

FIG. 5B SLICING

FIG. 5C PHASE ENCODING (WARP)

FIG. 5D FREQUENCY ENCODING (READOUT)

FIG. 5E FREQUENCY ENCODING (READOUT)

MR IMAGING METHOD AND MRI SYSTEM

CROSS REFERENCE TO RELATED APPLICATIONS

This application claims the benefit of Japanese Application No. 2004-026894 filed Feb. 3, 2004.

BACKGROUND OF THE INVENTION

The present invention relates to an MR imaging method and an MRI system.

More particularly, the present invention is concerned with an MR imaging method and an MRI system that clearly separates water in an object from fat therein for a short period of time so as to construct an image.

MR imaging methods and MRI systems are demanded to construct an accurate image for a short period of time.

Scanning an object whose spins are excited in the steady-state free precession (SSFP) method has advantage of producing an intense signal, which represents a high contrast, for a short scan time. On the other hand, the SSFP method confronts the problems that band artifact occurs and that it is hard to separate water from fat due to induction of an intense signal by fat.

As a technique for suppressing a magnetic resonance (MR) signal induced by fat among all MR signals, (1) a method employing a fat suppressing pulse (refer to, for example, "Magnetization Preparation during the Steady-state Fat-saturated 3D True FISP" written by Klauze Sheffler et al. (Magnetic Resonance in Medicine, 2001, Vol. 45, pp. 1075–1080), and (2) a method employing fluctuating equilibrium magnetic resonance (FEMR) (refer to, for example, "Fluctuating Equilibrium MRI" written by Shreyas S. Vasanawala et al. (Magnetic Resonance in Medicine, 1999, Vol. 42, pp. 876–883) are known.

However, when the distribution of static magnetic field strengths is not uniform, an image constructed in the method employing fat suppressing pulses or an image constructed according to the FEMR technique suffers from band artifact. Furthermore, fat suppression to be achieved using fat suppressing pulses disorders the steady state of a magnetic field, and is therefore unsuitable for the SSFP method.

U.S. Pat. No. 2,398,329 (Patent Document 1) has disclosed a technology of performing magnetic resonance imaging with spins in an object of imaging excited in the SSFP, and constructing a water image or a fat image on the basis of the sum or difference between echoes (MR signals) acquired using an RF pulse whose phase does not change and echoes acquired using an RF pulse whose phase is alternately changed between 0 radian and $\pi$ radian.

According to the method, since echoes are acquired using RF pulses exhibiting two kinds of phases, a scan time is long and a signal processing time is long.

The phase of an MR signal is affected by the inhomogeneity in static magnetic field strength. Attempts have been made to compensate for the inhomogeneity in static magnetic field strength in terms of facilities, but have confronted limitations. Consequently, there is an increasing demand for separating water from fat so as to construct an image while recognizing but being unaffected by the inhomogeneity in static magnetic strength.

The frequency of an MR signal induced by fat is different from that of an MR signal induced by water due to chemical shifts. A technology of separating water from fat by utilizing a phase difference deriving from a difference between the frequencies has been proposed.

A Dixon imaging method is a technique of acquiring two image data items, which represent MR signals that are induced by water and fat respectively and that are in phase or out of phase with each other, constructing a water image using the sum of the two image data items, and constructing a fat image using the difference thereof.

However, since the Dixon method requires production of two image data items, a scan time increases. Moreover, a rate at which the phase of a signal induced by fat differs from that of a signal induced by water decreases along with a decrease in static magnetic field strength. In order to acquire MR signals that are induced by water and fat respectively, that are in phase with each other, and that each include a gradient echo, a long echo time TE is needed. Consequently, signal attenuation increases. This poses a problem in that the Dixon method cannot be adapted to a system offering a low magnetic field.

In efforts to solve the foregoing problems, Japanese Unexamined Patent Application Publication No. 2001-414 (U.S. Pat. No. 3,353,826, Patent Document 2) has disclosed a technology of separating water from fat by adapting a single quadrature fat/water imaging (SQFWI) method to echoes acquired according to a phase cycling SSFP method.

The technology is briefed in Thesis 1 written by M. Miyoshi et al. and entitled "SSFP Fat/Water Separation by Fourier Transfer Phase Cycling and the Single Quadrature Dixon Method" (Proc. Intl. Soc., Magnetic Resonance in Medicine, Vol. 11, 2003, pp. 981).

The technology described in Japanese Unexamined Patent Application Publication No. 2001-414 and Thesis 1 is such that: a plurality of scans is performed by applying RF pulses, which exhibit different phases, with spins excited in the SSFP in order to acquire echoes; the echoes are two-dimensional Fourier-transformed and then two-dimensional inverse-Fourier-transformed; the resultant signals are handled according to the SQFWI method in order to remove the adverse effect of the inhomogeneity in a static magnetic field; and eventually, data representing water is separated from data representing fat.

Thesis 2 written by B. A. Hargreaves et al. and entitled "Fat Suppressed Steady-state Free Precession Imaging using Phase Detection" (Proc. Intl. Soc., Magnetic Resonance in Medicine, Vol. 11, 2003, pp. 548) describes that when the SSFP method is implemented under the conditions that a repetition time TR equals an in-phase time and an echo time TE equals a half of the in-phase time which equals a half of the repetition time TR, rectangular-wave signals whose waveforms look like a graph of a function and whose resonant frequencies are equivalent to a quotient of 2 by TR are acquired. The thesis concludes that signals sharing a single phase can be acquired successfully.

However, according to the method described in Thesis 2, the phases of signals induced by water and fat respectively are $\pi$ (radian) and are consistent with each other. A certain hypothesis is needed for separation of the signal induced by water from the signal induced by fat.

[Patent Document 1] Japanese Patent No. 2,398,329

[Patent Document 2] Japanese Unexamined Patent Application Publication No. 2001-414 (Japanese Patent No. 3,353,826)

The technology described in Japanese Unexamined Patent Application Publication No. 2001-414 and Thesis 1 has the drawback that the repetition time TR must equal the product of the in-phase time by 2/n and the echo time TE must equal the quotient of the in-phase time by n (where n denotes an integer equal to or larger than 3). Besides, the repetition time TR is so short that a system for realizing the technology will be large in scale and include special components. For example, when n equals 3, if a magnetic field strength is 0.7 T, the repetition time TR is 6.5 ms. If the magnetic field strength is 1.5 T, the repetition time TR is 3.1 ms. The system therefore becomes large in scale and includes special components.

Furthermore, since at least two scans must be performed, a scan time is long.

The method described in Thesis 2 stipulates as the contents of a pulse sequence database (PSD) that the repetition time TR equals the in-phase time and the echo time TE equals a half of the in-phase time. For example, when a magnetic field strength is 0.7 T, the repetition time TR is 9.8 ms. When the magnetic field strength is 1.5 T, the repetition time is 4.6 ms. The large-scale special system configuration described in Thesis 1 need not be adopted.

However, according to the method described in Thesis 2, signals induced by water and fat assume opposite signs (they are out of phase with each other by $\pi$ (radian)). A certain hypothesis must be established in order to discriminate the signal induced by water from the signal induced by fat. For example, the phases of the water and fat signals are discriminated from each other using an overall histogram, or any other complex processing is needed. At this time, there is a possibility that the phases of the water and fat signals may be identified inversely and that incorrect judgment may be invited.

Furthermore, according to the method of Thesis 2, since the phases of the water and fat signals are opposite to each other, echo times required for the water and fat signals are different from each other accordingly. Consequently, the fat signal strength gets lower.

As mentioned above, the related arts have the room for improvement from the viewpoints of a shorter processing time and easy and accurate separation of water from fat.

SUMMARY OF THE INVENTION

An object of the present invention is to provide an MR imaging method and an MRI system capable of shortening the time (scan time) elapsing from scanning to image construction, readily separating water from fat, and accurately constructing a water image and(or) a fat image.

According to the first aspect of the present invention, there is provided an MR imaging method of constructing a tomographic image of an object using MR signals induced by the object. The MR imaging method comprises the steps of: acquiring echoes from the object by implementing a pulse sequence that specifies the conditions that $TR=T_{IP} \times m$ and $TE=T_{IP} \times (m-1 \pm 1/n)$ should be established with spins excited in the steady-state free precession (SSFP) method, where TR denotes a repetition time, $T_{IP}$ denotes an in-phase time, TE denotes an echo time of a positive value, m denotes a natural number, and n denotes a natural number equal to or larger than 3, so that the object can be scanned with echoes induced by water and fat contained in the object in single quadrature with each other or with a phase difference between of 90° between the echoes induced by water and fat; performing frequency transformation on the acquired echoes so as to construct a tomographic image; compensating the transformed data for the inhomogeneity in a static magnetic field; and reconstructing an image, of which water and fat components are separated from each other, according to the result of the compensation.

According to the second aspect of the present invention, there is provided an MRI system for constructing a tomographic image of an object using MR signals induced by the object. The MRI system comprises: a means for implementing a pulse sequence that specifies the conditions that $TR=T_{IP} \times m$ and $TE=T_{IP} \times (m-1 \pm 1/n)$ should be established with spins excited in the steady-state free precession (SSFP) method, where TR denotes a repetition time, $T_{IP}$ denotes an in-phase time, TE denotes an echo time of a positive value, m denotes a natural number, and n denotes a natural number equal to or larger than 3, so that the object can be scanned with echoes induced by water and fat contained in the object in single quadrature with each other or with a phase difference of 90° between the echoes induced by the water and fat; a means for acquiring echoes, which are induced by implementing the pulse sequence, from the object; a transforming means for performing frequency transformation on the acquired echoes so as to construct a tomographic image; a means for compensating the transformed data for the inhomogeneity in a static magnetic field; and a means for reconstructing an image, of which water and fat components are separated from each other, using the results of the compensation.

According to the present invention, even a high-magnetic field strength system in which an in-phase time is short can construct images, which express water or fat separately from each other, according to the SSFP method.

Furthermore, according to the present invention, there is the advantage that when a repetition time TR is made equal to the product of the in-phase time by m (where m denotes a natural number) with spins excited in the SSFP, since both echoes induced by water and fat are affected by the inhomogeneity in a static magnetic field, an image unsusceptible to band artifact can be constructed.

Furthermore, according to the present invention, when an echo time TE is made equal to the product of the in-phase time by (m−1±1/n) (where m denotes a natural number, n denotes a natural number equal to or larger than 3, and TE assumes a positive value), the single quadrature fat/water imaging method can be adapted. In short, since the present invention does not employ the phase cycling method presented in Japanese Unexamined Patent Application Publication No. 2001-414 and Thesis 1, an object can be scanned with 1 NEX. This leads to a shorter scan time.

When the method described in Thesis 2 is employed, since a phase difference between echoes induced by water and fat is $\pi$ (radian) under the conditions of "m=1 and n=2," a certain hypothesis is needed. According to the present invention, adjoining signals can be checked to see if they are induced by water or fat. Whether an echo is induced by water or fat can be accurately and decisively verified.

Further objects and advantages of the present invention will be apparent from the following description of the preferred embodiments of the invention as illustrated in the accompanying drawings.

DETAILED DESCRIPTION OF THE INVENTION

FIRST EMBODIMENT

Referring to appended drawings, an MR imaging method and an MRI system in accordance with the first embodiment of the present invention will be described below.

(System Configuration and Basic Action)

Figure 1:
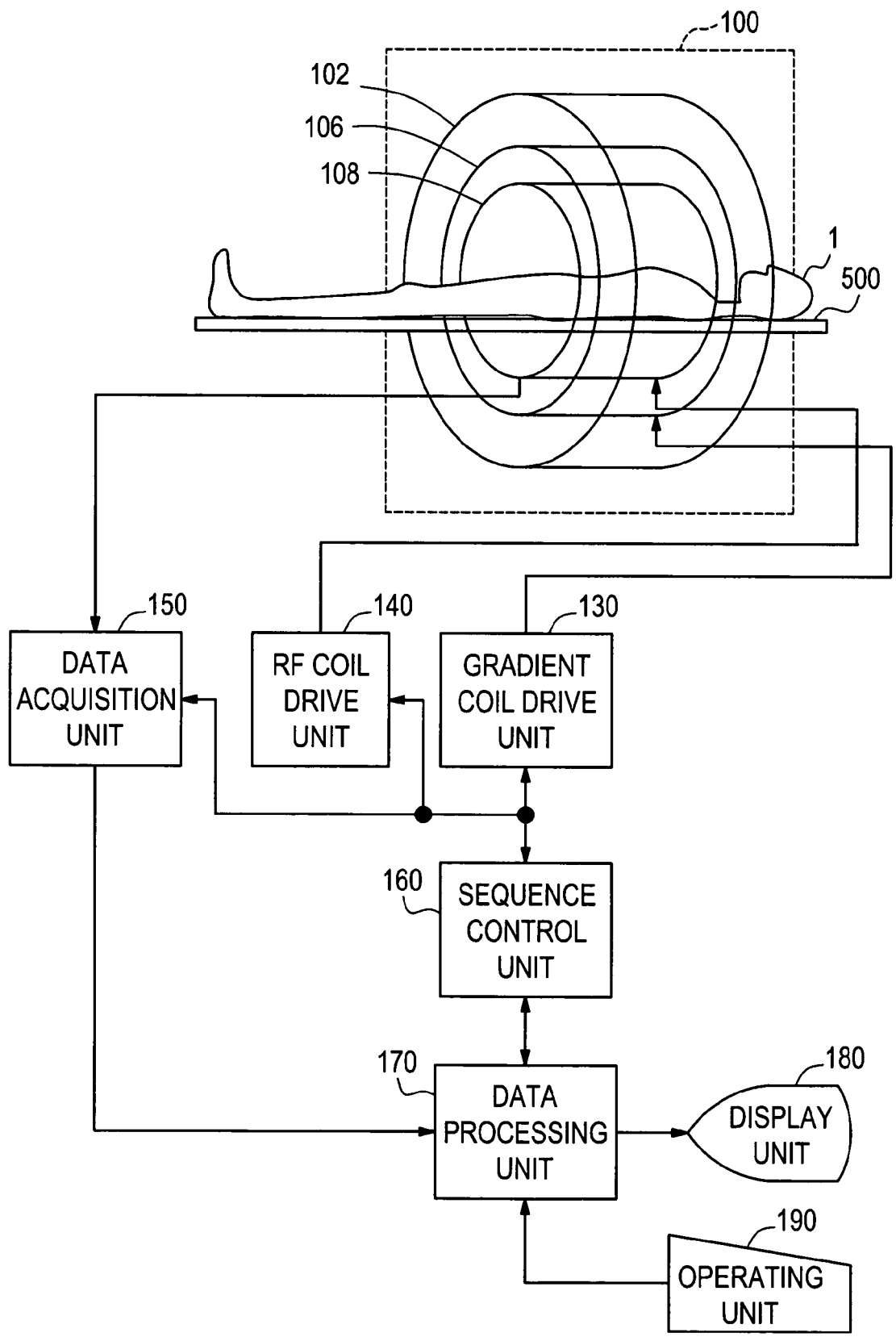
FIG. 1 is a block diagram of an MRI system that is an example of an embodiment of the present invention.

FIG. 1 schematically shows the configuration of the MRI system in accordance with the first embodiment of the present invention.

Referring to FIG. 1, the configuration of the MRI system in accordance with the first embodiment of the present invention and the basic action thereof will be described below.

The MRI system in accordance with the present embodiment of the present invention comprises a magnet system 100, a data acquisition unit 150, an RF coil drive unit 140, a gradient coil drive unit 130, a sequence control unit 160, a data processing unit 170, a display unit 180, and an operating unit 190.

The magnet system 100 includes a main field coil unit 102, a gradient coil unit 106, an RF coil unit 108. These coil units have a substantially cylindrical shape and are coaxially arranged in a substantially cylindrical bore of the magnet system 100.

An object of imaging 1 (or an object) such as a human body to be imaged by utilizing the magnetic resonance phenomenon lies down on a cradle 500, and is moved through the bore of the magnet system 100 by a carrying means, which is not shown, according to a region to be imaged.

The main field coil unit 102 produces a static magnetic field in the bore of the magnet system 100. The direction of the static magnetic field is generally parallel to the direction of the body axis of the object of imaging 1, and the static magnetic field is therefore a horizontal magnetic field.

The main field coil unit 102 is normally realized using a superconducting magnet. However, the main field coil unit is not limited to the adoption of the superconducting magnet but may be realized using a resistive magnet or the like.

The gradient coil unit 106 generates three magnetic field gradients, which are used to cause the strength of the static magnetic field produced by the main field coil unit 102 to undergo gradients, along three mutually orthogonal axes, that is, a slice axis, a phase axis, and a frequency axis. In order to generate the magnetic field gradients, the gradient coil unit 106 includes three gradient coils that are not shown. The gradient coil drive unit 130 is connected to the gradient coil unit 106, and applies a driving signal to the gradient coil unit 106 for the purpose of generation of the magnetic field gradients. The gradient coil drive unit 130 includes three drive circuits associated with the three gradient coils included in the gradient coil unit 106.

The magnetic field gradient whose direction corresponds to the direction of the slice axis shall be called a slicing magnetic field gradient. The magnetic field gradient whose direction corresponds to the direction of the phase axis shall be called a phase-encoding magnetic field gradient. The magnetic field gradient whose direction corresponds to the direction of the frequency axis shall be called a readout magnetic field gradient (or a frequency-encoding magnetic field gradient).

Assuming that the coordinate axes in the orthogonal coordinate system defined in the three-dimensional space are associated with the mutually orthogonal axes in the space of the static magnetic field and called X, Y, and Z axes, any of the X, Y, and Z axes may be regarded as the slice axis. In the present embodiment, the slice axis shall be aligned with the body axis of the object of imaging 1 and regarded as the Z axis. One of the other two axes shall be the phase axis and the other axis shall be the frequency axis.

Incidentally, the slice axis, phase axis, and frequency axis may be tilted with any slopes relative to the X, Y, and Z axes while maintaining the mutual orthogonality.

The RF coil drive unit 140 is connected to the RF coil unit 108. The RF coil drive unit 140 transmits a driving signal to the RF coil unit 108 and applies RF pulses thereto. The RF coil unit 108 produces high-frequency magnetic fields, which are used for excitation of spins in the object of imaging 1, in the space of a static magnetic field. Production of high-frequency magnetic fields shall be reworded into transmission of RF excitation signals, and the RF excitation signals shall be called RF pulses.

An electromagnetic wave induced by excited spins, that is, a magnetic resonance (MR) signal is received by the RF coil unit 108. The data acquisition unit 150 is connected to the RF coil unit 108. The data acquisition unit 150 acquires an echo received by the RF coil unit 108 (or an MR reception signal) in the form of digital data.

The MR signal detected by the RF coil unit 108 and acquired by the data acquisition unit 150 is a signal defined in the frequency domain, for example, a signal defined in the Fourier space.

The magnetic field gradients whose directions correspond to the directions of the phase axis and frequency axis are applied in order to encode the distribution of sources of MR signals along the two axes. For example, when the Fourier space is adopted as the frequency domain, the MR signals are provided as signals defined in the two-dimensional Fourier space. The two-dimensional Fourier space may be referred to as a k-space.

The phase-encoding magnetic field gradient and frequency-encoding (readout) magnetic field gradient determine the positions of sampled signals in the two-dimensional Fourier space.

The sequence control unit 160 is connected to each of the gradient coil drive unit 130, RF coil drive unit 140, and data acquisition unit 150.

The sequence control unit 160 is realized with a first signal computation and control means, for example, a first computer. The sequence control unit 160 includes a first memory that is not shown. Programs describing instructions to be given to the sequence control unit 160 and various kinds of data are stored in the first memory.

When the first computer runs the programs stored in the first memory, various facilities of the sequence control unit 160 are implemented.

The output terminal of the data acquisition unit 150 is connected to the data processing unit 170. Data acquired by the data acquisition unit 150 is transferred to the data processing unit 170. The data processing unit 170 is realized with a second signal computation and control means different from the first signal computation and control means included in the sequence control unit 160, for example, a second computer. The data processing unit 170 includes a second memory that is not shown. Programs describing instructions to be given to the data processing unit 170 and various kinds of data are stored in the second memory.

The data processing unit 170 is connected to the sequence control unit 160. The data processing unit 170 ranks higher than the sequence control unit 160 and manages various controls, which are extended by the sequence control unit 160, on a centralized basis. A concrete procedure is implemented when the data processing unit 170 runs any program stored in the second memory.

The data processing unit 170 stores data, which is acquired by the data acquisition unit 150, in a memory. A data space associated with the k-space is defined in the memory. The data processing unit 170 performs inverse frequency transformation, for example, two-dimensional inverse Fourier transform on data defined in the k-space, and thus reconstructs a scanned object image.

The display unit 180 is connected to the data processing unit 170. The display unit 180 is realized with a graphic display or the like. A reconstructed image sent from the data processing unit 170 and various pieces of information are displayed on the display unit 180.

Moreover, the operating unit 190 is connected to the data processing unit 170. The operating unit 190 is realized with a keyboard or the like including a pointing device. The operating unit 190 is manipulated by an operator (or user), whereby various kinds of instructions or pieces of information recorded in a pulse sequence database (PSD) are transferred to the data processing unit 170.

The operator (or user) interactively operates the MRI system via the display unit 180 and operating unit 190 that act under the control of the data processing unit 170.

(Outline of Actions Performed in the MRI System)

Figure 2:
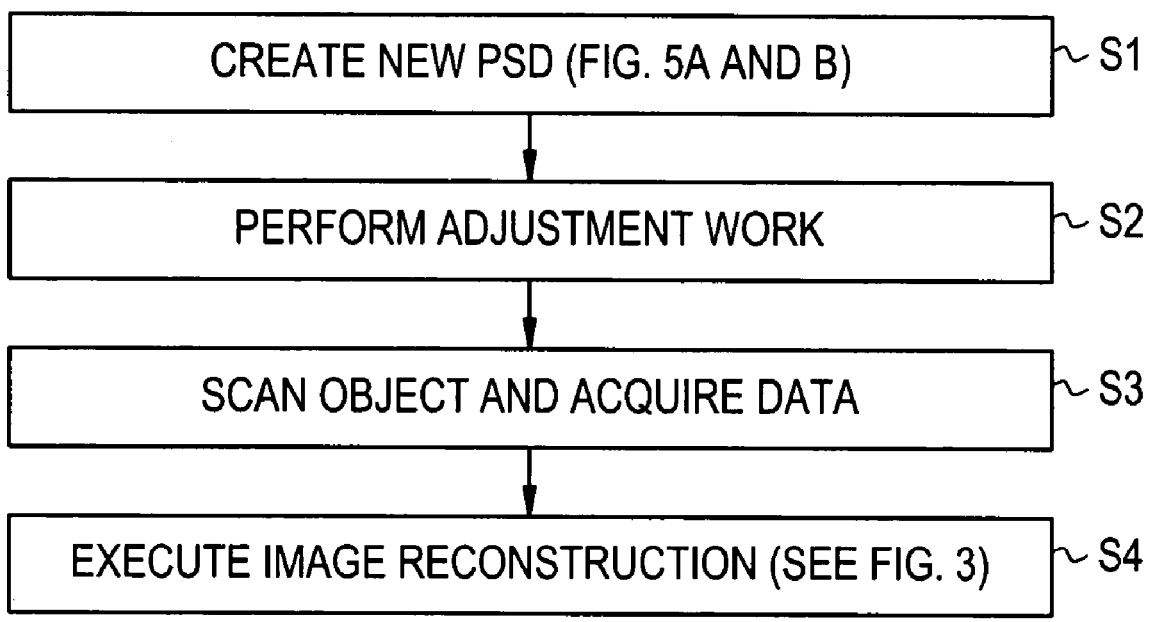
FIG. 2 is a flowchart describing an overall processing method adapted to the example of the embodiment of the present invention.

FIG. 2 is a flowchart outlining actions performed in the MRI system in accordance with the present invention.

Step S1: Creating a New Pulse Sequence Database

Figure 5:
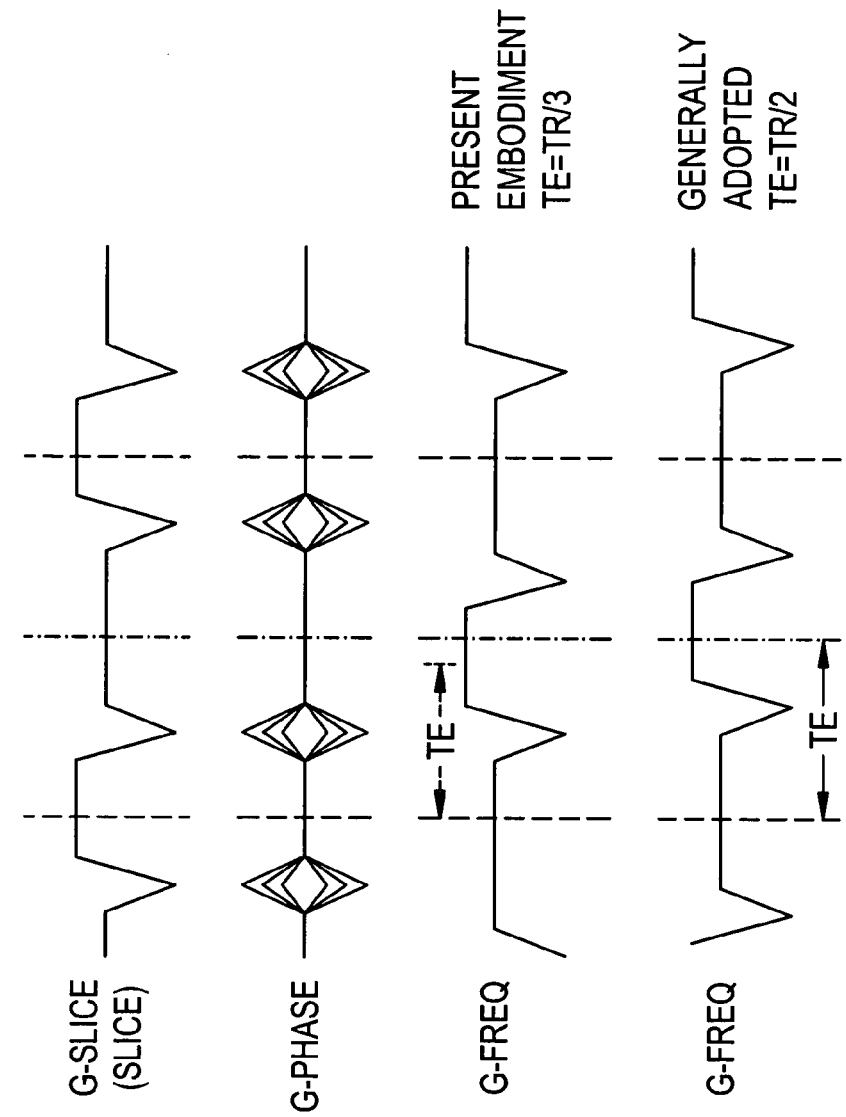
FIG. 5(a) to FIG. 5(e) show the contents of a pulse sequence database (PSD) included in the embodiment of the present invention or a comparative example.

The operator of the MRI system creates a new pulse sequence database (PSD), which is employed in the first embodiment of the present invention and which contains pulse sequences whose examples are shown in FIG. 5(*a*) to FIG. 5(*d*), using the operating unit 190 and display unit 180. The created PSD is stored in the memory included in the data processing unit 170.

The creation of the PSD is identical to the conventional one. The contents of the PSD whose example is shown in FIG. 5(*a*) to FIG. 5(*d*) are new pulse sequences employed in the present embodiment and serve as one of the features of the present invention.

The operating unit 190, display unit 180, and data processing unit 170 serve as a pulse sequence designating means included in the present invention.

Step S2: Performing Adjustment Work

Adjustment work to be described below is not a must for the present invention (an option) but is preferred for the reason described below.

Each of echoes returned from spins excited in the SSFP includes two components of a free induction decay (FID) (gradient echo) and a spin echo (SE) or a stimulated echo (STE). The spin echo (SE) and stimulated echo (STE) shall be generically called a spin echo. The adverse effects of the inhomogeneity in a magnetic field on the FID component and spin echo component are mutually symmetrical. There-fore, a phase difference and an echo time difference that derive from the inhomogeneity in a magnetic field are likely to occur.

If there are the phase difference and time difference between the components, an appropriate echo cannot be acquired. It is therefore preferred that the phases of the two components and the times thereof are agreed with each other prior to scanning in practice.

In order to agree the phases and times with each other, first, the phase difference between the FID component and the spin echo component SE or STE and the time difference between them are measured. Pulse sequences employed at this time are identical to those for SSFP imaging that will be described with reference to FIG. 5 except that a crusher magnetic field gradient is applied along the phase-encoding axis on behalf of the phase-encoding magnetic field gradient. The crusher magnetic field gradient is applied immediately before application of RF pulses.

Consequently, the phase of the spin echo component SE or STE is reset, and an echo including the FID component alone is induced. Thereafter, when the crusher magnetic field gradient is applied immediately after application of RF pulses, an echo including the spin echo component SE or STE alone is induced.

The phase difference and time difference between the resultant echoes are measured based on an echo time TE, whereby the phase difference and time difference between the FID component and spin echo component SE or STE can be obtained.

Step S3: Scanning an Object and Acquiring Data

After the foregoing adjustment work is completed, the data processing unit 170, sequence control unit 160, RF coil drive unit 140, and gradient coil drive unit 130 drive the main field coil unit 102, gradient coil unit 106, and RF coil unit 108, which constitute the magnet system 100, according to the contents of the PSD stored in the memory of the data processing unit 170 at step S1.

The data acquisition unit 150 receives MR signals, which are induced by the object of imaging 1 according to various magnetic fields applied to the object of imaging 1, from the RF coil unit 108.

Figure 6:
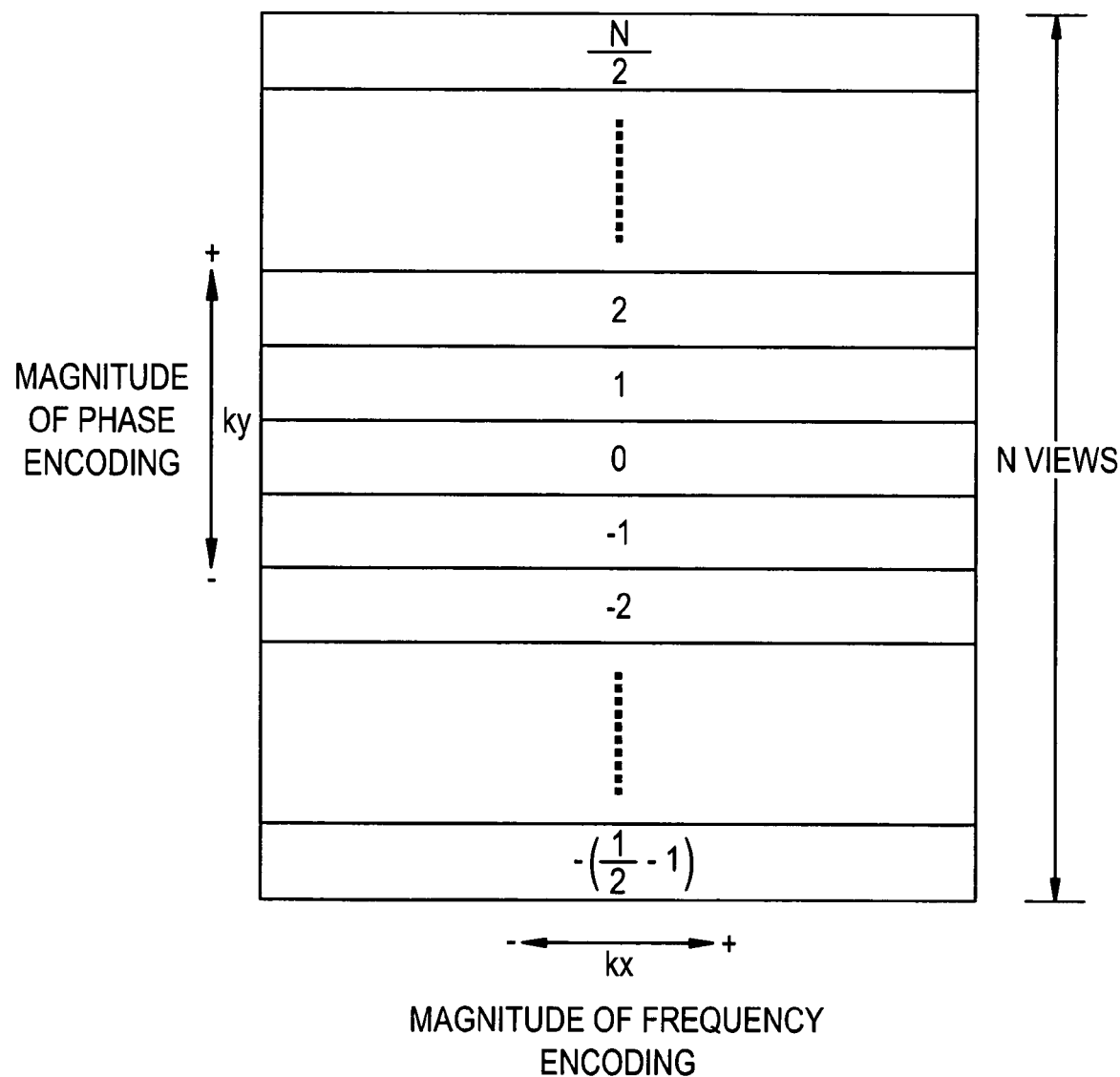
FIG. 6 shows the structure of a k-space defined in a memory included in the data processing unit included in the embodiment of the present invention.

The data processing unit 170 receives the MR signals acquired by the data acquisition unit 150 and stores it in the memory. In the memory, the data space associated with the k-space is defined as shown in FIG. 6.

The data processing unit 170, sequence control unit 160, RF coil drive unit 140, and gradient coil drive unit 130 themselves act according to the contents of the PSD as conventionally. However, since the contents of the PSD are, as mentioned above, different from the conventional ones, the MR signals resulting from the actions of the units are different from the conventional ones.

The basic actions of the data processing unit 170, sequence control unit 160, RF coil drive unit 140, gradient coil drive unit 130, main field coil unit 102, gradient coil unit 106, and RF coil unit 108 have been described so far.

The data processing unit 170, sequence control unit 160, RF coil drive unit 140, gradient coil drive unit 130, main field coil unit 102, gradient coil unit 106, and RF coil unit 108 serve as an imaging means included in the present invention. The RF coil unit 108 and data acquisition unit 150 serve as a data acquisition means included in the present invention.

Step S4: Executing Image Reconstruction

Figure 3:
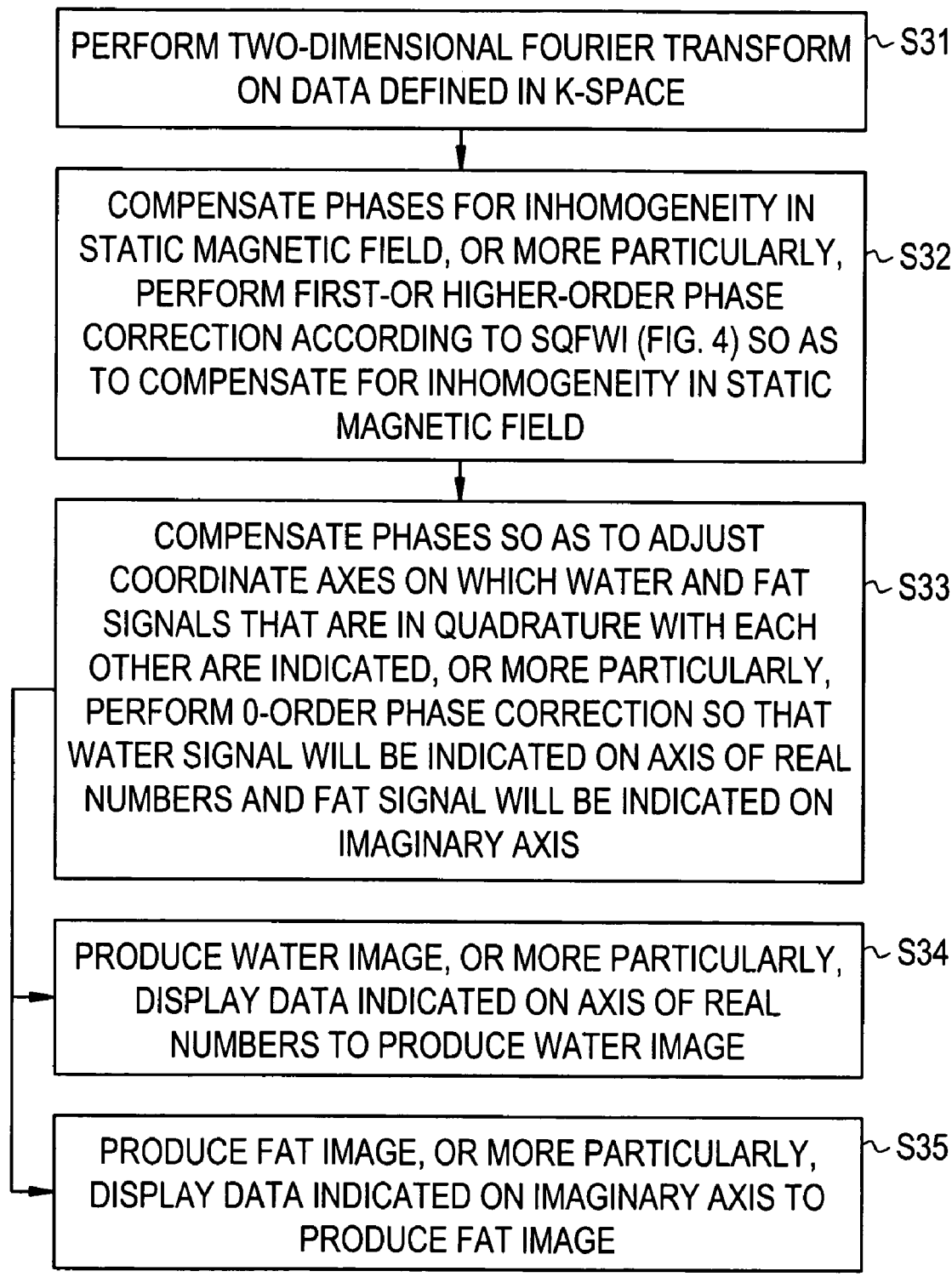
FIG. 3 is a flowchart describing an example of processing performed by a data processing unit shown in FIG. 2.

FIG. 3 is a flowchart outlining the processing of step S3 to be executed by the data processing unit 170. The contents of the processing will be outlined below.

At step S31, the data processing unit 170 two-dimensional Fourier-transforms data defined in the k-space whose example is shown in FIG. 6.

Figure 4:
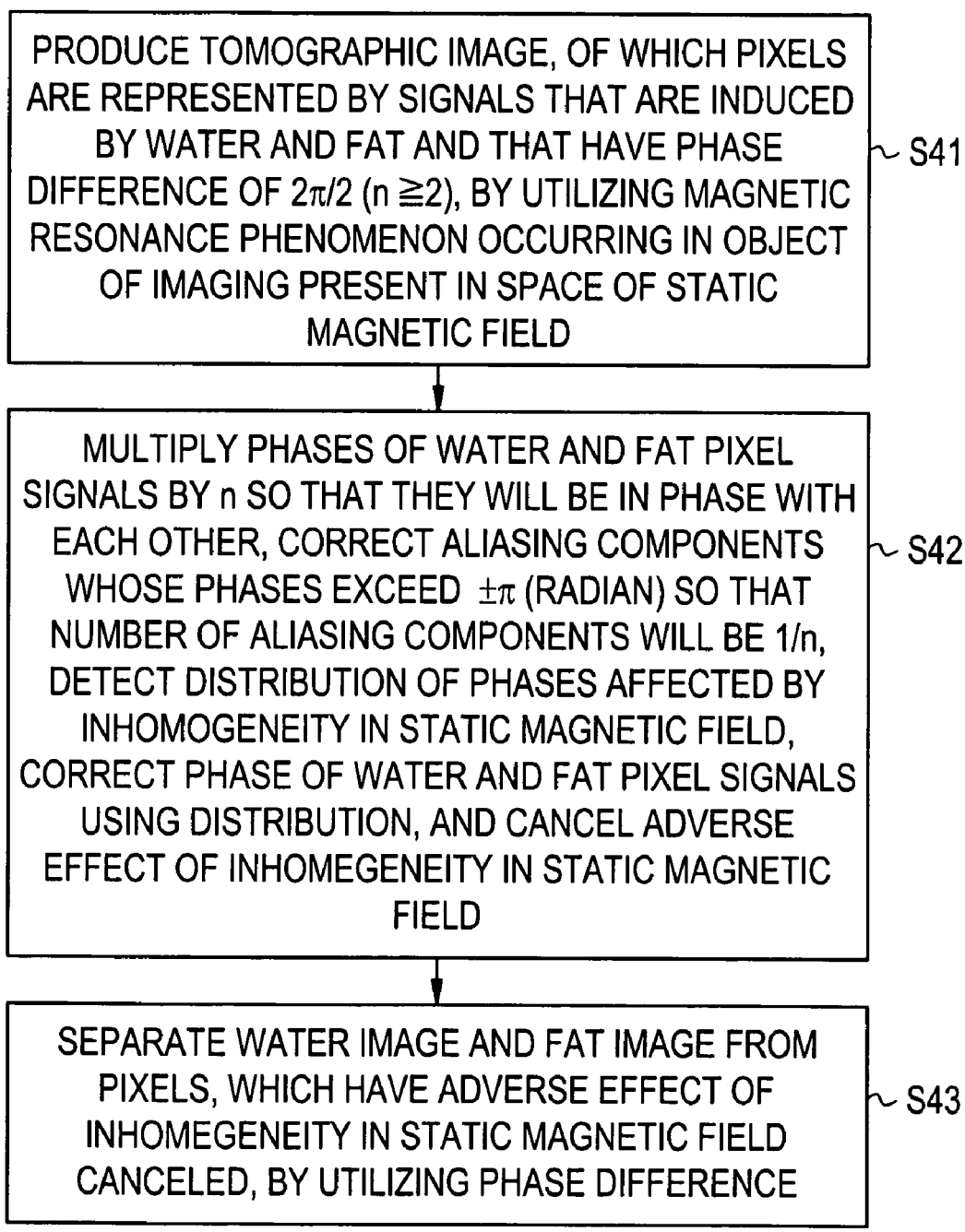
FIG. 4 is a flowchart describing the single quadrature fat/water imaging (SQFI) method implemented in the present invention.

At step S32, the data processing unit 170 performs first- or higher-order phase correction according to the single quadrature fat/water imaging (SQFWI) method described in FIG. 4, and thus compensates for the inhomogeneity in a static magnetic field.

At step S33, the data processing unit 170 performs phase compensation (second-order phase compensation) for adjustment of the coordinate axes in a coordinate system in which signals that are induced by water and fat and that are in quadrature with each other. Namely, for example, 0-order phase correction is performed so that the water signal will be indicated on the axis of real numbers and the fat signal will be indicated on the imaginary axis. Consequently, water and fat can be readily and clearly discriminated from each other.

At step S34, the data processing unit 170 displays data indicated on the axis of real numbers and thus produces a water image. Otherwise, at step S35, the data processing unit 170 displays data indicated on the imaginary axis and thus produces a fat image. Whether the water image or fat image is produced depends on a user. Needless to say, both the images may be successively produced.

FIG. 4 is a flowchart outlining the single quadrature fat/water imaging (SQFWI) method disclosed in Japanese Unexamined Patent Application Publication No. 2001-414. Even in the present embodiment, the SQFWI method is adapted to step S32 described in FIG. 3. The processing of step S32 will be described in comparison with the method disclosed in Japanese Unexamined Patent Application Publication No. 2001-414.

At step S41, for example, the RF coil unit 108 and data acquisition unit 150 produce a tomographic image whose pixels are represented by signals that are induced by water and fat and that have a phase difference of $2\pi/n$ ($n \geq 2$) (radian) by utilizing the magnetic resonance phenomenon that occurs in an object of imaging lying in the space of a static magnetic field.

The processing of step S41 corresponds to step S2 described with reference to FIG. 2 and employed in the present embodiment. The method disclosed in Japanese Unexamined Patent Application Publication No. 2001-414 and the processing employed in the present embodiment are, as described later with reference to FIG. 5, different from each other in terms of a condition that is a phase difference between signals induced by water and fat.

In the present embodiment, at a step corresponding to step S41, as described with reference to FIG. 5, the repetition time TR recorded in the PSD is made equal to the product of the in-phase time by m and the echo time TE recorded therein is made equal to the quotient of the in-phase time by n (where n denotes a value equal to or larger than 3) so that the signals induced by water and fat will be in phase with each other.

When the signals induced by water and fat are in phase with each other, since the signals are affected by the inhomogeneity in a static magnetic field to the same extent, the adverse effect of the inhomogeneity in a static magnetic field can be canceled.

For example, when n equals 4, a phase difference between the signal that is induced by water and associated with pixels expressing water and the signal that is induced by fat and associated with pixels expressing fat is $2\pi/4 = \pi/2$ (radian). Consequently, the water pixel signal and the fat pixel signal are in quadrature with each other while having a phase difference of 90°.

At step S42, the data processing unit 170 multiplies the phases of the water pixel signal and fat pixel signal by n so that the signals will be in phase with each other. Aliasing components whose phases exceed $\pm\pi$ (radian) are corrected to number in 1/n. The distribution of phases affected by the inhomogeneity in a static magnetic field is detected and used to correct the phases of the water and fat pixel signals. Thus, the adverse effect of the inhomogeneity in a static magnetic field is canceled.

For example, when the phases of the water and fat pixel signals are multiplied by n=4, the phase difference between the signals becomes $2\pi$ (radian). Namely, the water and fat pixel signals are in phase with each other. Aliasing components whose phases exceed $\pm\pi$ (radian) are corrected to number in 1/n (where n=4). The distribution of phases affected by the inhomogeneity in a static magnetic field is then detected and used to correct the phases of the water and fat pixel signals. Thus, the adverse effect of the inhomogeneity in a static magnetic field is canceled.

At step S43, The data processing unit 170 separates a water image and a fat image from the pixels, which have the adverse effect of the inhomogeneity in a static magnetic field canceled, on the basis of the phase difference.

As mentioned above, pixels expressing water and pixels expressing fat can be separated from each other, wherein the signal associated with the pixels expressing water, that is, a signal induced by water and the signal associated with the pixels expressing fat, that is, a signal induced by fat have the adverse effect of the inhomogeneity in a static magnetic field canceled, and have a phase difference of $\pi/2$ (radian), that is, are in quadrature with each other.

As mentioned above, the image construction technology of causing signals induced by water and fat to have a phase difference of $\pi/2$ (radian) and then separating the water signal from the fat signal shall be called in this specification a "single quadrature fat/water imaging (SQFWI) method."

As mentioned above, in the present embodiment, the SQFWI method is adopted in order to compensate for the inhomogeneity in a static magnetic field (first phase compensation). Signals induced by water and fat and being in quadrature with each other are sampled. Thereafter, 0-order phase compensation (second phase compensation) is performed for simple and accurate image construction. Consequently, the water signal is indicated on the axis of real numbers and the fat signal is indicated on the imaginary axis.

Namely, images expressing water or fat separately from each other are reconstructed, and the water image or fat image is displayed if necessary.

Pulse Sequence Database (PSD)

FIG. 5(a) to FIG. 5(d) show an example of the contents of the PSD that are used to scan an object whose spins are excited in the steady-state free precession (SSFP) method so that the phases of signals induced by water and fat will be in single quadrature with each other.

When it says that spins are excited in the SSFP method, it means that excitation pulse trains are kept applied at short intervals (TR<T2) so that the phases of angular momentums, that is, the phase of spins will be aligned to produce a magnetization. The SSFP method has the advantage that a signal having maximum strength and representing a high contrast can be produced despite a short scan time. On the other hand, the SSFP method has the drawbacks that band artifact occurs, a strong signal is induced by fat, and it is hard to separate water from fat. The present invention has solved the drawbacks.

FIG. 5(a) shows a pulse sequence for an RF signal. FIG. 5(b) shows a pulse sequence for generation of a slicing magnetic field gradient. FIG. 5(c) shows a pulse sequence for generation of a phase-encoding magnetic field gradient (warp). FIG. 5(d) shows a pulse sequence for generation of a frequency-encoding (readout) magnetic field gradient.

FIG. 5(e) shows a generally adopted pulse sequence for generation of a frequency-encoding magnetic field gradient which is described in Japanese Unexamined Patent Application Publication No. 2001-414 and presented for comparison with the pulse sequence for generation of a frequency-encoding (readout) magnetic field gradient employed in the first embodiment of the present invention and shown in FIG. 5(d).

[Features of the Contents of the PSD Included in the Present Embodiment]

(1) First Feature

The first feature of the contents of the PSD included in the present embodiment lies in that the unit repetition time TR (1TR) equals the in-phase time. Conventionally, the repetition time TR is not limited to any specific value but set to any value.

The reason why the repetition time TR is limited to a specific value as it is in the present embodiment is to make echoes induced by water and fat in phase with each other. When the water and fat echoes are in phase with each other, the echoes are affected by the same inhomogeneity in a static magnetic field. The SQFWI technique can perfectly cancel the adverse effect of the inhomogeneity in a static magnetic field. Consequently, echoes having water and fat echoes thereof separated from each other can be acquired by performing one scan.

(2) Second Feature

The second feature of the contents of the PSD included in the present embodiment lies in that the echo time TE does not meet the conventionally adopted condition of TE=TR/2 so that an echo induced by water and an echo induced by fat will be in single quadrature with each other while having a phase difference of 90°.

The method described in Japanese Unexamined Patent Application Publication No. 2001-414 and a generally adopted method are such that an echo is, as shown in FIG. 5(e), regarded a signal produced in the middle of one repetition time 1TR (TE=TR/2), and the echo time TE is a time from the middle of either of two adjoining RF pulses to the middle of an echo. On the other hand, in the present embodiment of the present invention, as shown in FIG. 5(d), the echo time is defined as TE=TR/3 and shorter than the time from the middle of either of two adjoining RF pulses to the middle of an echo.

As mentioned above, the relationship between the echo time TE and repetition time TR specified in the pulse sequence for generation of a frequency-encoding (readout) magnetic field gradient according to the present embodiment is different from the typical relationship between the echo time TE and repetition time TR described in Japanese Unexamined Patent Application Publication No. 2001-414 or the like. This is because an echo induced by water and an echo induced by fat are in single quadrature with each other while having a phase difference of 90°.

Owing to the above phase relationship, for example, an echo induced water can be indicated on the axis of real numbers and an echo induced by fat can be indicated on the imaginary axis, and the water and fat echoes can be clearly separated from each other. For example, when the echo indicated on the axis of real numbers is displayed, an image expressing water contained in the object of imaging 1 can be produced. On the other hand, when the echo indicated on the imaginary axis is displayed, an image expressing fat contained in the object of imaging 1 can be produced.

The actions performed in the MRI system according to the contents of the PSD whose examples are shown in FIG. 5(a) to FIG. 5(d) and FIG. 5(e) will be described below. Incidentally, the pulse sequence is implemented from left to right in the drawings.

[Producing a Magnetic Field and Acquiring Echoes]

At step S3 in FIG. 2, RF pulses are applied as shown in FIG. 5(a) in order to excite spins. At this time, spins are selectively excited by applying a slicing magnetic field gradient G-slice shown in FIG. 5(b). The excitation of spins is repeated in cycles of the repetition time TR. One view is acquired during one repetition time 1TR.

At step S3 in FIG. 2, a frequency-encoding (readout) magnetic field gradient G-phase is, as shown in FIG. 5(d) and FIG. 5(e), applied during one repetition time 1TR, and echoes are read out via the RF coil unit 108.

At step S3 in FIG. 2, a phase-encoding magnetic field gradient G-phase is, as shown in FIG. 5(d), applied immediately after excitation of spins and immediately before the next excitation of spins. The pair of phase-encoding magnetic field gradients G-phase is symmetrical to each other in terms of strength and polarity. Owing to the symmetry, the first phase-encoding magnetic field gradient G-phase causes phase encoding to proceed in a forward direction and the second phase-encoding magnetic field gradient G-phase causes phase encoding to proceed in a reverse direction. The magnitude of phase encoding is varied for every repetition time 1TR.

[Storing Data in the K-Space]

At step S3 in FIG. 2, the RF coil unit 108 and data acquisition unit 150 read echoes, whereby the data in the k-space is sampled.

FIG. 6 is a conceptual diagram showing the k-space. In the k-space, the axis of abscissas is associated with the frequency axis and the axis of ordinates is associated with the phase axis. A plurality of sideways long rectangles indicates data sampling positions on the phase axis. Numerals written in the rectangles indicate the magnitude of phase encoding. The magnitude of phase encoding is normalized with $\pi/N$ where N denotes the number of samples in the direction of the phase axis. The number of sampling in the direction of the phase axis may be reworded as the number of views.

According to the pulse sequence described in Japanese Unexamined Patent Application Publication No. 2001-414 and shown in FIG. 5(e), TE=TR/2 is established, and the magnitude of phase encoding is 0 at the middle of the phase axis ky. The magnitude of phase encoding gradually increases from the center to both ends, but the polarities of the increases are opposite to each other. The sampling interval, that is, the difference in the magnitude of phase encoding is $\pi/N$. Incidentally, since m equals 4, the phase difference between an echo induced by water and an echo induced by fat is $\pi/2$ (radian).

On the other hand, in the case of the pulse sequence employed in the present embodiment and shown in FIG. 5(d), TE=TR/3 is established, and the magnitude of phase encoding is 0 at the middle of the phase axis ky. Incidentally, since m equals 3, the phase difference between an echo induced by water and an echo induced by fat is $2\pi/3$ (radian).

[Phase Cycling Technique]

According to the phase cycling technique described in Japanese Unexamined Patent Application Publication No. 2001-414, data acquisition is performed by varying a flip angle a plurality of times or at least twice, that is, by varying the phase of an RF pulse at least twice in units of $2\pi \cdot k/M$ for each repetition time 1TR. Incidentally, M denotes an integer equal to or larger than 2, and k denotes 0, 1, or M−1. $2\pi \cdot k/M$ is a difference in the phase of an RF pulse made for each repetition time 1TR. When a scan is performed by varying the phases of an RF pulse at least twice, k equals 0 or 1.

(1) When k equals 0, the phase difference is 0. Consequently, the phase of an RF pulse is unvaried, and spins are excited with RF pulses, of which phases remain unchanged, every time. When spins are excited, one group of data items whose Fourier transforms are defined in the k-space is acquired. The group of data items (echoes) shall be called data f(0).

(2) When k equals 1, the difference in the phase of an RF pulse is $2\pi/M$. Consequently, spins are excited with RF pulses whose phases are varied in units of $2\pi/M$ for each repetition time 1TR. When spins are thus excited, other group of data items whose Fourier transforms are defined in the k-space is acquired. This group of data items (echoes) shall be called data f(1).

According to the present invention, only one scan is performed. The present invention is a special case where the phase cycling technique is employed with M set to 1 and k set to M/2.

According to the method disclosed in Japanese Unexamined Patent Application Publication No. 2001-414, at least two scans are performed with different flip angles. It therefore takes much time. The amount of data to be stored in a memory is large, and the data processing time is long.

On the other hand, according to the present embodiment, M is set to 1 and k is set to 0. A scan is performed by varying the phase of an RF pulse in units of $\pi$ (radian). The number of excitations required for acquisition of one view is 1 (1 NEX). Spins are excited with RF pulses having opposite phases. When spins are thus excited, one group of data items f whose Fourier transforms are defined in the k-space is acquired. According to the present embodiment, the scan time can be halved, and the storage capacity of a memory can be halved. Moreover, a data processing time to be described later can be halved.

Echoes f induced according to the foregoing method are provided by the expression (1) described below.

[Mathematical 1]

$$f(k) = \frac{A(1 - E_2 \exp i\xi)}{B(1 - E_2 \cos\xi) - C(E_2 \cos\xi)} E_3 \exp\left(i\frac{\theta_{chemi} + \theta}{2}\right) \quad (1)$$

where $\xi = \phi - \theta - \theta_{chemi}$ $A = M_0(1 - E_1)\sin\alpha$ $B = 1 - E_1 \cos\alpha$ $C = E_2(E_1 - \cos\alpha)$ $E_1 = \exp(-TR/T_1)$ $E_2 = \exp(-TR/T_2)$ $E_3 = \exp(-TR/2/T_2)$ $\phi = 2\pi k/M$ $\zeta$ denotes the phase of spins. The phase of spins $\zeta$ depends on the phase $\phi$ of an RF pulse, a phase error $\theta$ caused by the inhomogeneity in a magnetic field or a magnetic susceptibility, and a phase error $\theta_{chemi}$ deriving from a chemical shift. M0 denotes an initial magnetization.

According to the present embodiment, $\phi$ equals $\pi$ (radian). The phase of spins $\zeta$ therefore equals $\pi - \theta - \theta_{chemi}$.

Furthermore, since the phase of an RF pulse remains unchanged during the repetition time TR, $\theta_{chemi}$ equals $2\pi$ (radian). The phase of spins $\zeta$ equals $\pi - \theta$ irrespective of whether the spins are spins in water or spins in fat.

At step S31 in FIG. 3, the data processing unit 170 two-dimensional Fourier-transforms echoes f for production of an image that is a result of scanning.

At step S31 in FIG. 2, the data processing unit 170 two-dimensional Fourier-transforms the data defined in the k-space. Preferably, two-dimensional fast Fourier transform (IFFT) is performed in order to reconstruct a tomographic image.

Since data is little affected by the phase error $\theta$, both the water and fat components of the tomographic image produced by performing two-dimensional Fourier transform hardly suffer from band artifact despite the inhomogeneity in a static magnetic field.

Although signals induced by water and fat are in phase with each other at the time of application of RF pulses, the signals have a phase difference of $2\pi/n$ (radian) at a time instant TE due to a difference in a gyromagnetic ratio (chemical shifts).

The phase difference is utilized in order to separate water from fat according to the SQFWI technique described with reference to FIG. 4. Namely, (1) Like step S42 in FIG. 4, the phases of echoes are multiplied by n so that the echo induced by water and the echo induced by fat will be in phase with each other.

(2) Like step S42 in FIG. 4, aliasing components whose phases exceed $\pm\pi$ (radian) are corrected. The phase errors in the echoes are corrected using the distribution of phases of the aliasing components that number in 1/n.

(3) Like step S43 in FIG. 4, water is separated from fat on the basis of the phase difference between the echo induced by water and the echo induced by fat, that is, the phase difference of 90°.

The adoption of the SQFWI technique is preferred in a point that water can be accurately separated from fat.

The SQFWI technique is utilized in order to compensate the two-dimensional Fourier transforms for the inhomogeneity in a static magnetic field. A signal induced by water and a signal induced by fat which have a phase difference of $2\pi n$ are separated from each other, whereby data expressing a water image and data expressing a fat image are produced.

(First Variant of the First Embodiment)

According to the first embodiment, the repetition time TR is limited to the value of the in-phase time. However, the repetition time TR can be set to a multiple of the in-phase time by any natural number (m).

For example, when a magnetic field strength is 1.5 T, the shortest in-phase time (m=1) is 4.6 ms and the second shortest in-phase time (m=1) is 9.2 ms.

According to the present invention, even when a magnetic field system that generates a high magnetic field strength and offers the short in-phase time is employed, after spins are excited in the SSFP method, a signal induced by water can be separated from a signal induced by water.

In the aforesaid embodiment, the echo time TE is set to the quotient of the in-phase time by n. Whether the echo time TE is deviated from the in-phase time in a positive or negative direction does not count.

For example, when a magnetic field strength is 1.5 T, the shortest in-phase time is 4.6 ms. The echo time TE may be set to the quotient of the in-phase time by 3, that is, 1.53 ms or may be set to a value calculated by subtracting the quotient of the in-phase time by 3 from the in-phase time, that is, 3.067 ms.

When the second shortest in-phase time is adopted, the repetition time TR is set to the product of the in-phase time by 2, that is, 9.2 ms. The echo time TE may be set to a value calculated by adding the quotient of the in-phase time by 3 to the in-phase time, that is, 6.13 ms or may be set to a value calculated by subtracting the quotient of the in-phase time by 3 from the in-phase time, that is, 3.067 ms.

Moreover, n may equal 4. In this case, the echo time TE may be calculated by subtracting the quotient of the in-phase time by 4 from the in-phase time, that is, 3.45 ms or may be calculated by adding the quotient of the in-phase time by 4 to the in-phase time, that is, 5.75 ms.

Namely, according to the present invention, the repetition time TR and echo time TE can be determined according to the conditional expressions (1) below.

Typical Contents of the PSD for Spins Excited in the SSFT Method

Repetition time $TR = T_{IP} \times m$ (1)

Echo time $TE = T_{IP} \times (m - 1 \pm 1/n)$ (2)

where $T_{IP}$ denotes the in-phase time, m denotes a natural number, and n denotes a natural number equal to or larger than 3. The echo time TE assumes a positive value.

(Conditional Expressions 1)

Comparison of a Scan Time with the One Employed in a Comparative Example

According to the method that is described in Japanese Unexamined Patent Application Publication No. 2001-414 and that separates water from fat by adapting the SQFWI technique to the phase cycling SSFP method, the contents of the PSD must specify $TR = T_{IP} \times 2/n$ and $TE = T_{IP}/n$ (where n denotes an integer equal to or larger than 3). When n is set to 3, if a magnetic field strength is 0.7 T, the repetition time TR is 6.5 ms. If the magnetic field strength is 1.5 T, the repetition time TR is as short as 3.1 ms. The price of a system offering such a high magnetic field strength is very high.

Moreover, the method described in Japanese Unexamined Patent Application Publication No. 2001-414 requires two or more data acquisitions.

According to the method described in Thesis 2, the contents of the PSD specify $TR = T_{IP}$ and $TE = T_{IP}/2$. According to the method, when a magnetic field strength is 0.7 T, the repetition time TR is 9.8 ms. When the magnetic field strength is 1.5 T, the repetition time TR is 4.6 ms. This poses no problem in terms of construction of a magnetic field system. However, the issue of separating water from fat is not discussed.

Second Variant of First Embodiment

In the aforesaid embodiment, two-dimensional Fourier transform is adopted as a method of analyzing an echo by decomposing it into frequency components. Alternatively, any other frequency analysis method can be adopted.

When two-dimensional Fourier transform is adopted, two-dimensional fast Fourier transform is preferred for speedy computation.

Third Variant of First Embodiment

An object of data acquisition performed by the data acquisition unit 150 is a full echo. However, according to the present embodiment, the echo time TE does not correspond to a half of the repetition time TR. Therefore, the object of data acquisition may be a fractional echo or a full echo. The method in accordance with the present invention provides freedom for data acquisition.

When a fractional echo is acquired, the data processing unit 170 may perform two-dimensional Fourier transform and two-dimensional inverse Fourier transform on the fractional echo. Otherwise, the fractional echo may be interpolated in order to fill it with 0s.

Advantages of First Embodiment

Since the SQFWI technique is adapted to the SSFP method that is implemented based on the contents of the PSD, after the spins in water and fat are excited in the SSFP method, an image whose water and fat components can be separated from each other can be constructed.

According to the contents of the PSD employed in the present embodiment, the repetition time TR is set to the product of the in-phase time by m (where m denotes a natural number) in order to implement the SSFP method. Consequently, a signal induced by water and a signal induced by fat alike are affected by the inhomogeneity in a static magnetic field. Eventually, the adverse effect of the inhomogeneity in a static magnetic field can be canceled.

Moreover, in the present embodiment, unlike the method described in Japanese Unexamined Patent Application Publication No. 2001-414, that is, the phase cycling SSFT fat/water image construction method, it is unnecessary to change the phase of an RF pulse a plurality of times and perform a plurality of scans. This results in a short scan time. Moreover, an amount of stored data is small and a storage capacity of a memory is small. Furthermore, the signal processing time required by the data processing unit 170 is shortened.

According to the method described in Thesis 2, a signal induced by water and a signal induced by fat are out of phase with each other by π (radian). This method cannot accurately discriminate water from fat without a hypothesis. In contrast, according to the method of the present embodiment, the water signal and fat signal are in single quadrature with each other. Namely, the water signal and fat signal have a phase difference of 2π/n (radian). Consequently, the water signal can be indicated on the axis of real numbers and the fat signal can be indicated on the imaginary axis. Eventually, the phases of the water signal and fat signal can be accurately and decisively identified based on the phase difference between adjoining water and fat signals.

SECOND EMBODIMENT

Figure 7:
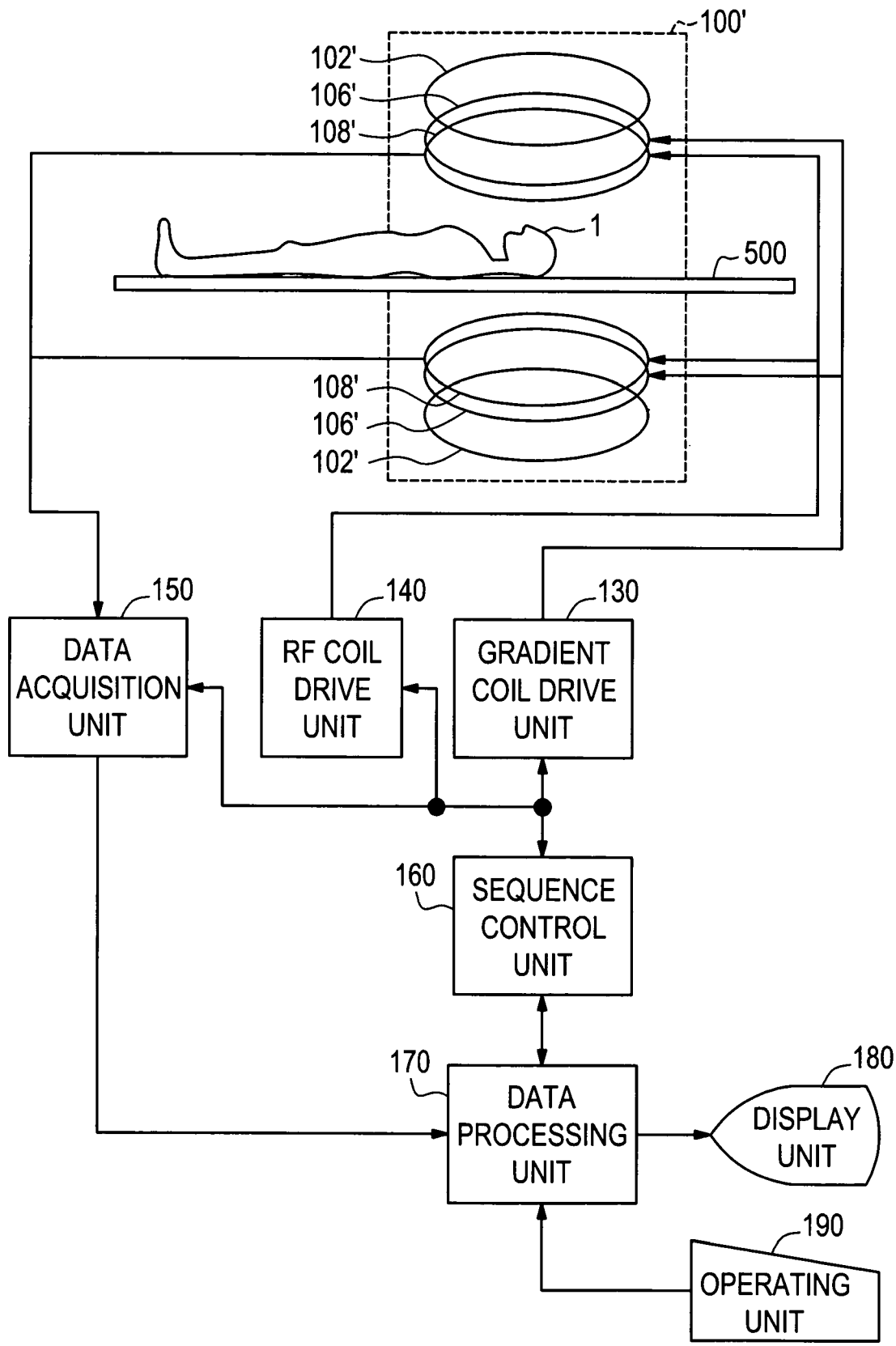
FIG. 7 is a block diagram showing the configuration of an MRI system that is an example of the second embodiment of the present invention.

FIG. 7 shows the configuration of an MRI system in accordance with the second embodiment of the present invention.

The MRI system shown in FIG. 7 has the same components as the MRI system shown in FIG. 1 except a magnet system 100'. The magnet system 100' will be mainly described below.

The magnet system 100' includes a main field magnet unit 102', a gradient coil unit 106', and an RF coil unit 108'.

Each of the main field magnet unit 102' and coil units comprises a pair of magnets or coils opposed to each other with a space between them. Moreover, the magnets and coils have a substantially disk-like shape and share the same center axis. The object of imaging 1 lying down on the cradle 500 is carried into the bore of the magnet system 100' by means of a carrying means that is not shown.

The main field magnet unit 102' produces a static magnetic field in the bore of the magnet system 100'. The direction of the static magnetic field is substantially orthogonal to the body-axis direction of the object 1. Namely, the main field magnet unit 102' produces a so-called perpendicular magnetic field. The main field magnet unit 102' is formed with, for example, a permanent magnet. However, the main field magnet unit 102' is not limited to the permanent magnet but may be formed with a superconducting magnet or a resistive magnet.

The gradient coil unit 106' produces three magnetic field gradients that are used to cause the static magnetic field strength to undergo gradients along three axes perpendicular to one another, that is, a slice axis, a phase axis, and a frequency axis. For production of the magnetic field gradients, the gradient coil unit 106' includes three gradient coils that are not shown.

Assuming that the coordinate axes defined to be orthogonal to one another in the space in which the static magnetic field is produced are X, Y, and Z axes, any of the axes can be regarded as the slice axis. One of two remaining axes is regarded as the phase axis, and the other axis is regarded as the frequency axis. Moreover, the slice axis, phase axis, and frequency axis may be tilted to have any slopes relative to the X, Y, and Z axes respectively while maintaining mutual orthogonality. Even in the system of the present embodiment, the direction of the body axis of the object 1 shall be regarded as the Z-axis direction.

The RF coil unit 108' receives electromagnetic waves, that is, magnetic resonance signals induced by spins in the object 1 lying in the static magnetic field space which are excited with application of RF pulses. The signals received by the RF coil unit 108' are transferred to the data acquisition unit 150.

Even in the MRI system shown in FIG. 7, similarly to the MRI system shown in FIG. 1, the aforesaid processing is performed.

As mentioned above, according to the present embodiment, a magnetic resonance imaging system capable of producing an image, which is unaffected by band artifact, according to the SSFP method can be realized. Moreover, a magnetic resonance imaging system capable of separating water from fat for imaging with the spins in water and fat excited in the SSFP method can be realized.

Many widely different embodiments of the invention may be configured without departing from the spirit and the scope of the present invention. It should be understood that the present invention is not limited to the specific embodiments described in the specification, except as defined in the appended claims.

The invention claimed is:

1. An MR imaging method for constructing a tomographic image of an object using MR signals induced by the object, comprising the steps of:

acquiring echoes from the object by implementing a pulse sequence, which specifies the conditions that $TR=T_{IP}\times m$ and $TE=T_{IP}\times(m-1\pm1/n)$ should be established with spins excited in the steady-state free precession (SSFP) method, where TR denotes a repetition time, $T_{IP}$ denotes an in-phase time, TE denotes an echo time of a positive value, m denotes a natural number, and n denotes a natural number equal to or larger than 3, so that the object can be scanned with an echo induced by water contained in the object and an echo induced by fat contained therein in single quadrature with each other or with a phase difference of 90° between the echoes induced by water and fat;

constructing a tomographic image by performing frequency transformation on the acquired echoes;

compensating the transformed data for the inhomogeneity in a static magnetic field; and reconstructing an image, of which water and fat components are separated from each other, according to the result of the compensation.

2. An MR imaging method according to claim 1, wherein at said transformation step, two-dimensional Fourier transform is adopted as frequency transformation in order to construct a tomographic image.

3. An MR imaging method according to claim 2, wherein two-dimensional fast Fourier transform is adopted as two-dimensional Fourier transform.

4. An MR imaging method according to claim 1, wherein the single quadrature fat/water imaging technique is adopted as a method of compensating data, which results from the transformation, for the inhomogeneity in a static magnetic field.

5. An MR imaging method according to claim 4, wherein the single quadrature fat/water imaging technique comprising the steps of: multiplying phases of signals associated with data produced at the transformation step by n so that the signal induced by water and the signal induced by fat will be in phase with each other in order to compensate for the inhomogeneity in a static magnetic field; correcting aliasing components whose phases exceed $\pm\pi$ (radian); diminishing the corrected aliasing components to number in 1/n to detect the distribution of phases affected by the inhomogeneity in a static magnetic field; and correcting the phases of the signals associated with the data produced at the transformation step based on the detected distribution of phases.

6. An MR imaging method according to claim 5, wherein at said image reconstruction step, 0-order correction is performed so that a signal induced by water can be indicated on the axis of real numbers and a signal induced by fat can be indicated on the imaginary axis, data retrieved from the axis of real numbers is used to construct a water image, and data retrieved from the imaginary axis is used to construct a fat image.

7. An MR imaging method according to claim 1, wherein full echoes are acquired at said step of acquiring echoes, and said frequency transformation is performed on the full echoes at said transformation step.

8. An MR imaging method according to claim 1, wherein fractional echoes are acquired at said step of acquiring echoes, and said frequency transformation is performed on the fractional echoes at said transformation step.

9. An MR imaging method according to claim 1, wherein prior to acquisition of echoes, an FID component and a spin echo component of each echo are adjusted so that their phases and times will be agreed with each other.

10. An MRI system for constructing a tomographic image of an object using MR signals induced by said object, comprising:

a device for implementing a pulse sequence, which specifies the conditions that $TR=T_{IP}\times m$ and $TE=T_{IP}\times(m-1\pm1/n)$ should be established with spins excited in the steady-state free precession (SSFP) method, where TP denotes a repetition time, $T_{IP}$ denotes an in-phase time, TE denotes an echo time of a positive value, m denotes a natural number, and n denotes a natural number equal to or larger than 3, so that the object can be scanned with an echo induced by water contained in the object and an echo induced by fat contained therein in single quadrature with each other or with a phase difference of 90° between the echoes induced by water and fat;

a device for acquiring echoes from said object by implementing said pulse sequence;

a transformation device for constructing a tomographic image by performing frequency transformation on the acquired echoes;

a device for compensating the transformed data for the inhomogeneity in a static magnetic field; and a device for reconstructing an image, of which water and fat components are separated from each other, according to the result of the compensation.

11. An MRI system according to claim 10, wherein said transformation device adopts two-dimensional Fourier transform as the frequency transformation so as to construct the tomographic image.

12. An MRI system according to claim 11, wherein said transformation device adopts two-dimensional fast Fourier transform as the two-dimensional Fourier transform.

13. An MRI system according to claim 10, wherein said compensation device adopts the single quadrature fat/water imaging technique so as to compensate for the inhomogeneity in a static magnetic field, multiplies phases of signals, which are associated with data produced by said transformation device, by n so that the signal induced by water and the signal induced by fat will be in phase with each other, corrects aliasing components whose phases exceed ±π (radian), detects the distribution of phases affected by the inhomogeneity in a static magnetic field by diminishing the corrected aliasing components down to a 1/n, and corrects the phases of signals, which are associated with the data produced by the transformation device, on the basis of the detected distribution of phases.

14. An MRI system according to claim 13, wherein 0-order correction is performed so that a signal induced by water can be indicated on the axis of real numbers and a signal induced by fat can be indicated on the imaginary axis, data retrieved from the axis of real numbers is used to construct a water image, and data retrieved from the imaginary axis is used to construct a fat image.

15. An MRI system according to claim 10, wherein the device for acquiring echoes acquires full echoes, and the transformation device performs the frequency transformation on the full echoes.

16. An MRI system according to claim 10, wherein the device for acquiring echoes acquires fractional echoes, and the transformation device performs the frequency transformation on the fractional echoes.

17. An MRI system according to claim 11, wherein:
said MRI system includes a magnet system comprising: a main field coil unit for producing a horizontal static magnetic field parallel to the body axis of an object of imaging; a gradient coil unit for producing magnetic fields, which cause the static magnetic field strength to undergo gradients in the directions of a slice axis, a frequency axis, and a phase axis respectively that are orthogonal to one another; and an RF coil unit that excites spins in the object of imaging and detects the excited spins; and said pulse sequence is implemented in production of magnetic fields by said gradient coil unit and said RF coil unit.

18. An MRI system according to claim 10, further comprising a device for, prior to acquisition of echoes, adjusting an FID component of each echo and a spin echo component thereof so as to agree the phases and times thereof with each other.

* * * * *